(12) United States Patent
Cui et al.

(10) Patent No.: US 11,276,601 B2
(45) Date of Patent: Mar. 15, 2022

(54) APPARATUS AND METHODS FOR MANIPULATING POWER AT AN EDGE RING IN A PLASMA PROCESSING DEVICE

(71) Applicant: APPLIED MATERIALS, INC., Santa Clara, CA (US)

(72) Inventors: Linying Cui, Sunnyvale, CA (US); James Rogers, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/845,479

(22) Filed: Apr. 10, 2020

(65) Prior Publication Data

US 2021/0320022 A1    Oct. 14, 2021

(51) Int. Cl.
   *H01J 37/32* (2006.01)
   *H01L 21/683* (2006.01)
   *H01L 21/67* (2006.01)

(52) U.S. Cl.
   CPC ........ *H01L 21/6831* (2013.01); *H01J 37/321* (2013.01); *H01L 21/67069* (2013.01); *H01L 21/67155* (2013.01)

(58) Field of Classification Search
   CPC ........... H01L 21/6831; H01L 21/67069; H01L 21/67155; H01J 37/321
   See application file for complete search history.

(56) References Cited

U.S. PATENT DOCUMENTS

| | | | |
|---|---|---|---|
| 6,899,799 B2 | 5/2005 | Ngan et al. | |
| 7,214,619 B2 | 5/2007 | Brown et al. | |
| 7,268,076 B2 | 9/2007 | Brown et al. | |
| 8,089,026 B2 | 1/2012 | Sellers | |
| 9,593,411 B2 | 3/2017 | Hoffman et al. | |
| 2002/0125223 A1* | 9/2002 | Johnson | H01J 37/321 219/121.43 |
| 2004/0261946 A1* | 12/2004 | Endoh | H01L 21/67069 156/345.15 |
| 2013/0288483 A1 | 10/2013 | Sadjadi et al. | |
| 2016/0284522 A1 | 9/2016 | Eto et al. | |
| 2017/0018411 A1 | 1/2017 | Sriraman et al. | |

(Continued)

OTHER PUBLICATIONS

PCT International Search Report and Written Opinion for PCT/US2020/066807 dated Apr. 15, 2021.

*Primary Examiner* — Yuechuan Yu
(74) *Attorney, Agent, or Firm* — Moser Taboada (57) ABSTRACT

Methods and apparatus for processing a substrate positioned on a substrate support assembly are provided. For example, a substrate support assembly includes an electrostatic chuck having one or more chucking electrodes embedded therein for chucking a substrate to a substrate support surface of the electrostatic chuck; an edge ring disposed on the electrostatic chuck and surrounding the substrate support strike; two or more radio frequency (RF) power sources coupled to the edge ring and at least one of a baseplate disposed beneath the electrostatic chuck or an electrode disposed in the electrostatic chuck; a matching network coupling the edge ring to the two or more RF power sources; and an RF circuit coupling the edge ring to the two or more RF power sources, the RF circuit configured to simultaneously tune at least one of an RF amplitude or an RF phase of respective signals of the two or more RF power sources.

14 Claims, 8 Drawing Sheets

(56) References Cited

U.S. PATENT DOCUMENTS

2017/0062187 A1   3/2017  Radomski et al.
2018/0025891 A1   1/2018  Marakhtanov et al.
2019/0013184 A1* 1/2019  Cui .................. H01J 37/32183

* cited by examiner

APPARATUS AND METHODS FOR MANIPULATING POWER AT AN EDGE RING IN A PLASMA PROCESSING DEVICE

FIELD

Embodiments of the present disclosure generally relate to apparatus and methods for manipulating radio frequency power in a plasma process.

BACKGROUND

An edge ring (e.g., process kit) is a circular component which surrounds a perimeter of a substrate, such as a semiconductor substrate, during plasma processing in a process chamber. Due to exposure of the edge ring to plasma within the process chamber, the edge ring may erode and require replacement or maintenance over time. When the edge ring is severely eroded, the shape of the plasma sheath at the edge of the substrate distorts and changes the plasma processing characteristics at the edge of the substrate. The change in plasma processing characteristics causes undesirable processing effects at the edge of the substrate, thus reducing the yield near the edge of the substrate. Also, adjusting the sheath enables adjusting the tilt of high aspect ratio features at the extreme edge of the substrate. Other methods and apparatus for controlling a plasma sheath exist, such as edge rings which are movable relative to the substrate. However, the inventors believe that such moving parts can undesirably lead to increased particle formation in the process chamber. Alternatively, an independent radio frequency (RF) generator with a separate RF match network can directly drive the edge ring. However, such generators do not work well if multiple RF frequencies are used for the substrate bias, and multiple generators with a dual frequency match network can be very expensive.

Therefore, the inventors have provided improved apparatus and methods for processing a substrate.

SUMMARY

Methods and apparatus for manipulating dual-radio frequency power in a plasma process are disclosed herein. In some embodiments, a substrate support assembly includes an electrostatic chuck having one or more chucking electrodes embedded therein for chucking a substrate to a substrate support surface of the electrostatic chuck; an edge ring disposed on the electrostatic chuck and surrounding the substrate support surface; two or more radio frequency (RF) power sources coupled to the edge ring and at least one of a baseplate disposed beneath the electrostatic chuck or an electrode disposed in the electrostatic chuck; a matching network coupling the edge ring to the two or more RF power sources; and an RF circuit coupling the edge ring to the two or more RF power sources, the RF circuit configured to simultaneously tune at least one of an RF amplitude or an RF phase of respective signals of the two or more RF power sources.

In accordance with at least some embodiments, a process chamber includes a chamber body; a lid disposed on the chamber body; a plasma apparatus positioned above the lid; and a substrate support assembly positioned within the chamber body, the substrate support assembly comprising: an electrostatic chuck having one or more chucking electrodes embedded therein for chucking a substrate to a substrate support surface of the electrostatic chuck; an edge ring disposed on the electrostatic chuck and surrounding the substrate support surface; two or more radio frequency (RF) power sources coupled to the edge ring and at least one of a baseplate disposed beneath the electrostatic chuck or an electrode disposed in the electrostatic chuck; a matching network coupling the edge ring to the two or more RF power sources; and an RF circuit coupling the edge ring to the two or more RF power sources, the RF circuit configured to simultaneously tune at least one of an RF amplitude or an RF phase of respective signals of the two or more RF power sources.

In accordance with at least some embodiments, a method of processing a substrate positioned on a substrate support assembly includes supplying radio frequency (RF) power at two or more RF frequencies from two or more RF power sources to each of an electrode disposed beneath the substrate and to an edge ring positioned adjacent thereto through a matching network coupled between the two or more RF power sources and each of the electrode and the edge ring; and tuning at least one of RF amplitude or RF phase of respective signals of the two or more RF power sources using an edge tuning circuit disposed between the two or more RF power sources and the edge ring to control a difference in a plasma sheath adjacent the edge ring as compared to a plasma sheath adjacent the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The present disclosure generally relates to apparatus and methods that control radio frequency (RF) amplitude of a substrate support assembly. Compared to conventional methods and apparatus that use movable edge rings, the methods and apparatus described herein have reduced particle concern and provide independent control of each frequency (e.g., two or more frequencies) of multiple RF generators, as opposed to moving the overall sheath up and down. Moreover, compared to conventional methods and apparatus that use a separate RF generator for the edge ring at a single frequency, a tuning circuit working for two or more RF frequencies can save the cost of two or more separate RF generators and matches for the edge ring.

The present disclosure includes several tuning circuits that can tune at two or more RF frequencies independently and at the same time. Because each RF frequency has a unique effect on several plasma parameters, such as ion energy distribution and ion angular distribution, having independent control of the RF frequencies provides more tuning capability for a substrate edge. For example, in at least some embodiments, an electrode may be positioned beneath a perimeter of a substrate and/or an edge ring positioned on a perimeter of the substrate support assembly.

During operation, as a plasma sheath drops adjacent the edge ring, e.g., due to edge ring erosion, a capacitance of a variable capacitor can be adjusted to affect an RF amplitude near the edge of the substrate. Adjustment of the RF amplitude via the electrode and variable capacitor results in an adjustment of the plasma sheath near the substrate perimeter. Bending of the sheath at the perimeter of the substrate can focus ions (e.g., increase etch rate) or defocus ions (e.g., decrease etch rate) in a region of approximately 0 to 5 mm-10 min (depending on process conditions) from the edge of the wafer.

Accordingly, benefits of the disclosure include the ability to adjust plasma sheaths at the substrate edge in lieu of replacing chamber components, thus improving device yield while mitigating downtime, particles and reducing expenditures on consumables. Additionally, examples described herein allow for the plasma sheath to be adjusted at the substrate edge without affecting the plasma parameters at substrate center, thus providing a tuning knob for extreme edge process profile control and feature tilting correction.

Figure 1:
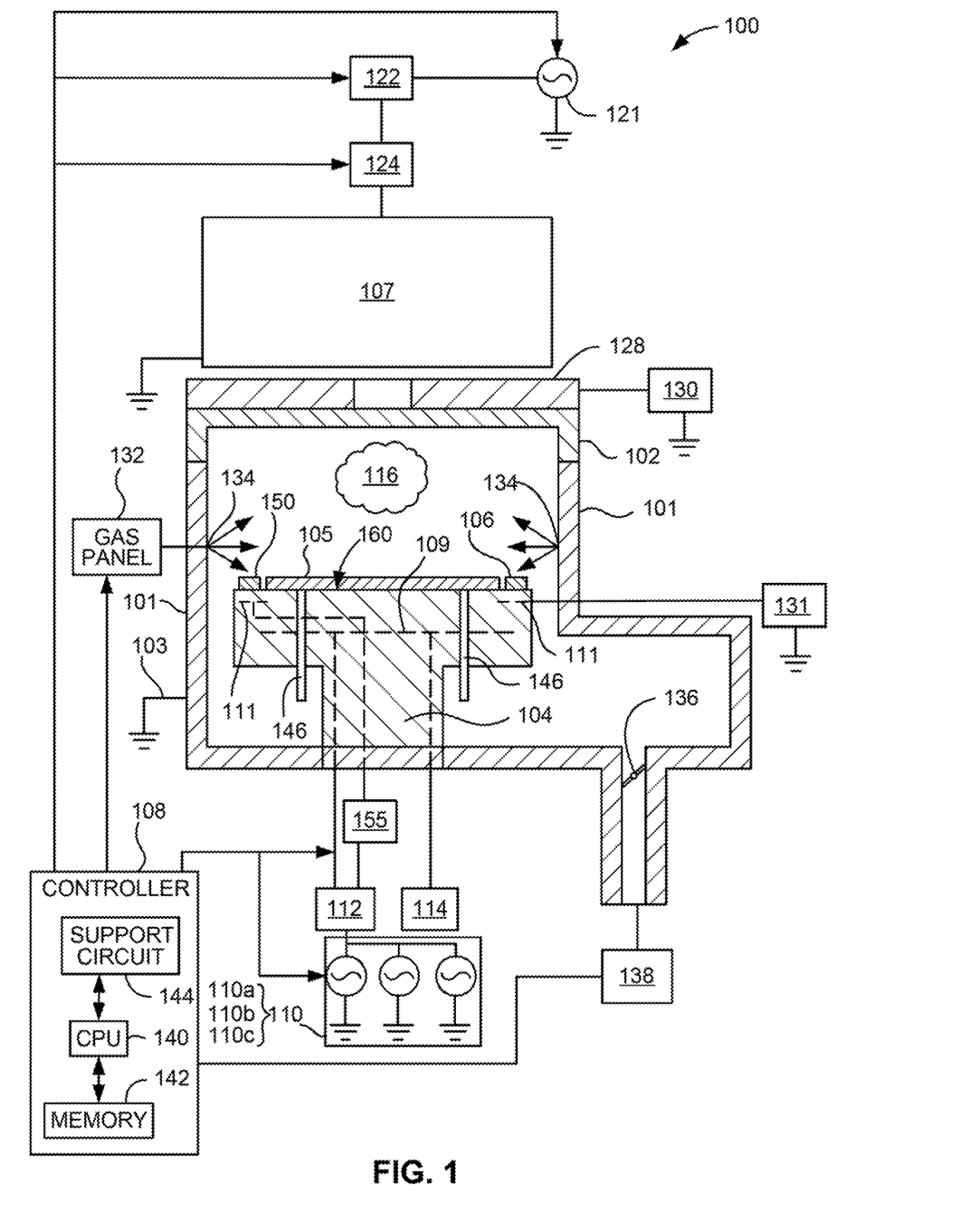
FIG. 1 is a schematic sectional side view of a process chamber, according to at least some embodiments of the disclosure.

FIG. 1 is a schematic sectional view of a process chamber 100, according to one example of the disclosure. The process chamber 100 includes a chamber body 101 and a lid 102 disposed thereon that together define an inner volume. The chamber body 101 is typically coupled to an electrical ground 103. A substrate support assembly 104 is disposed within the inner volume to support a substrate 105 thereon during processing (use). An edge ring 106 is positioned around the periphery of the substrate 105 on the substrate support assembly 104. The edge ring 106 is disposed on and surrounds a substrate support surface of an electrostatic chuck.

The process chamber 100 can be one of an inductively coupled plasma (ICP) chamber, and/or a capacitively coupled plasma (CCP) chamber. For example, in at least some embodiments, the process chamber 100 is a chamber including a CCP apparatus 107 on top. In at least some embodiments, the top of the process chamber 100 can be grounded.

The CCP apparatus 107 generates a plasma of reactive species within the process chamber 100, and a system controller 108 is adapted to control systems and subsystems of the process chamber 100, as described above.

The substrate support assembly 104 includes one or more electrodes, such as a first electrode 109 and a second electrode, such as a ring electrode 111 surrounding the first electrode 109. The first electrode 109 and the ring electrode 111 are each coupled to multiple RF power sources 110 providing different frequencies through a matching network 112 and a resonant edge tuning circuit 155 (e.g., hereinafter simply referred to as an edge tuning circuit 155) including variable capacitors and inductors. The matching network 112 ensures that the output of the RF power sources 110 are effectively coupled to the plasma to maximize the energy coupled to the plasma. The matching network 112 typically matches 50 ohms to the complex impedance of the plasma. To facilitate dynamic matching as the plasma characteristics change during processing, the matching network 112 can be continuously adjusted to ensure that a match is maintained throughout the process.

The edge tuning circuit 155 is an RF circuit that operates near resonance which enables adjusting a voltage higher or/and lower than a source voltage, as described in greater detail below. The RF power sources 110 are utilized to bias the substrate 105 disposed on an upper surface 160 of the substrate support assembly 104. The RF power sources 110 may illustratively be a source of up to about 10,000 W (but not limited to about 10,000 W) of RF energy, which may be provided at one or multiple frequencies, such as 400 kHz, 2 MHz, 13.56 MHz, 27 MHz, 40 MHz, or 60 MHz. The RF power sources 110 can include two or more independent RF power sources that are configured to provide RF energy at two or more corresponding frequencies. For example, in at least some embodiments, the RF power sources 110 can include an RF power source 110a and an RF power source 110b each configured to provide RF energy at a corresponding frequency, e.g., 400 kHz and 2 MHz, and an optional RF power source 110c cart be provided and can be configured to provide RF energy at a frequency of 400 kHz, 2 MHz, and/or 40 MHz. The RF power sources 110 may be capable of producing either or both of continuous or pulsed power. The first electrode 109 is coupled to a chucking power source 114 to facilitate chucking of the substrate 105 to the upper surface 160 during processing.

The CCP apparatus 107 is disposed above the lid 102 and is configured to capacitively couple RF power into the process chamber 100 to generate a plasma 116 within the process chamber 100. The CCP apparatus 107 can be adjusted as desired to control the profile or density of the plasma 116 being formed. The CCP apparatus 107 is coupled to an RF power supply 121 through a matching network 122 (similar to the matching network 112) via an RF feed structure 124. The RF power supply 121 may illustratively be capable of producing up to about 60,000 W (but not limited to about 60,000 W) at a tunable frequency in a range from 50 kHz to 150 MHz, although other frequencies and powers may be utilized as desired for particular applications.

In some examples, a power divider (not shown), such as a dividing capacitor, may be provided between the RF feed structure 124 and the RF power supply 121 to control the relative quantity of RF power provided. For example, in embodiments when process chamber 100 includes an ICP apparatus, the power divider may be used. In such embodiments, the power divider may be incorporated into the matching network 122.

A heater element 128 may be disposed on the lid 102 to facilitate heating the interior of the process chamber 100. The heater element 128 may be disposed between the lid 102 and a plasma apparatus, such as the CCP apparatus 107. In some examples, the heater element 128 may include a resistive heating element and may be coupled to a power supply 130, such as an AC power supply, configured to provide sufficient energy to control the temperature of the heater element 128 within a desired range.

During operation, the substrate 105, such as a semiconductor wafer or other substrate suitable for plasma processing, is placed on the substrate support assembly 104. Substrate lift pins 146 are movably disposed in the substrate support assembly 104 to assist in transfer of the substrate 105 onto the substrate support assembly 104. After positioning of the substrate 105, process gases are supplied from a gas panel 132 through entry ports 134 into the inner volume of the chamber body 101. The process gases are ignited into a plasma 116 in the process chamber 100 by applying power from the RF power supply 121 to the CCP apparatus 107. In some examples, power from the RF power sources 110 may also be provided through the matching network 112 to the first electrode 109 and/or the edge ring 106 within the substrate support assembly 104. Alternatively or additionally, power from the RF power sources 110, e.g., two or more of the RF power sources 110a-110c may also be provided through the matching network 112 to a baseplate and/or other electrode within the substrate support assembly 104. In at least some embodiments, a power source 131 can be connected to the substrate support assembly 104 (e.g., to the ring electrode 111) and configured to provide a clamping force to clamp the edge ring 106 to the substrate support to a ceramic ring 250 disposed on the substrate support as described below), e.g., to improve thermal control of the edge ring 106, during operation.

The pressure within the interior of the process chamber 100 may be controlled using a valve 136 and a vacuum pump 138. The temperature of the chamber body 101 may be controlled using fluid-containing conduits (not shown) that run through the chamber body 101.

The process chamber 100 includes the system controller 108 to control the operation of the process chamber 100 during processing. The system controller 108 comprises a central processing unit (CPU) 140 a memory 142 (e.g., non-transitory computer readable medium), and support circuits 144 for the CPU 140 and facilitates control of the components of the process chamber 100. The system controller 108 may be one of any form of general-purpose computer processor that can be used in an industrial setting for controlling various chambers and sub-processors. The memory 142 stores software (source or object code) that may be executed or invoked to control the operation of the process chamber 100 in the manner described herein.

During processing, an upper surface 150 of the edge ring 106 may become eroded. The erosion changes the plasma characteristics which may alter the plasma 116 at or near the edge of the substrate 105. In one embodiment, the software of the memory 142 comprises the instructions for manipulating various RF circuits provided herein to obtain a target amplitude of the voltage at the edge ring 106 in order to tune the process profile and/or feature tilting on the edge of the substrate 105.

Figure 2A:
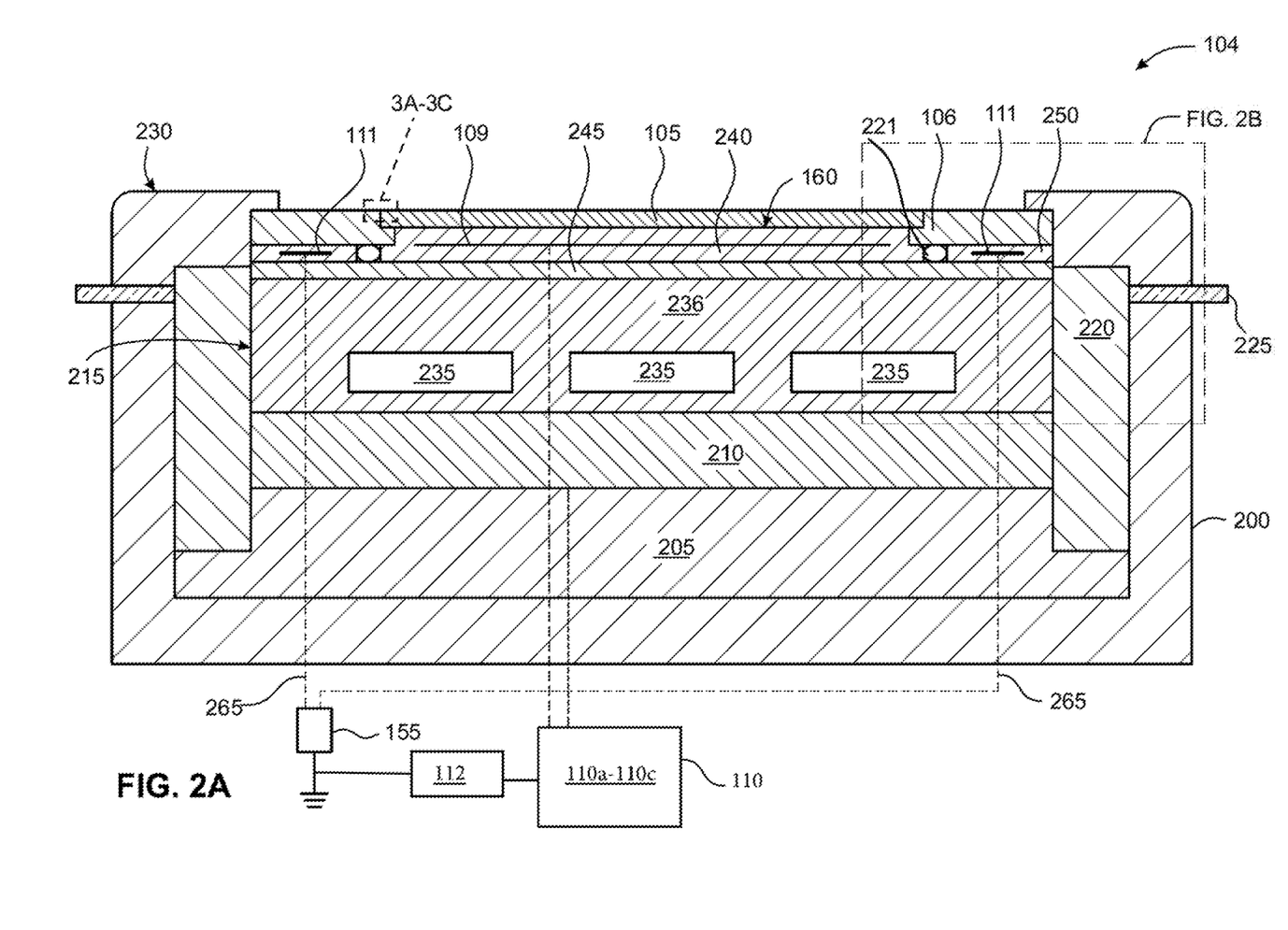
FIGS. 2A and 2B illustrate enlarged schematic side views of portions of the substrate support assembly shown in FIG. 1, according to at least some embodiments of the disclosure.
Figure 2B:
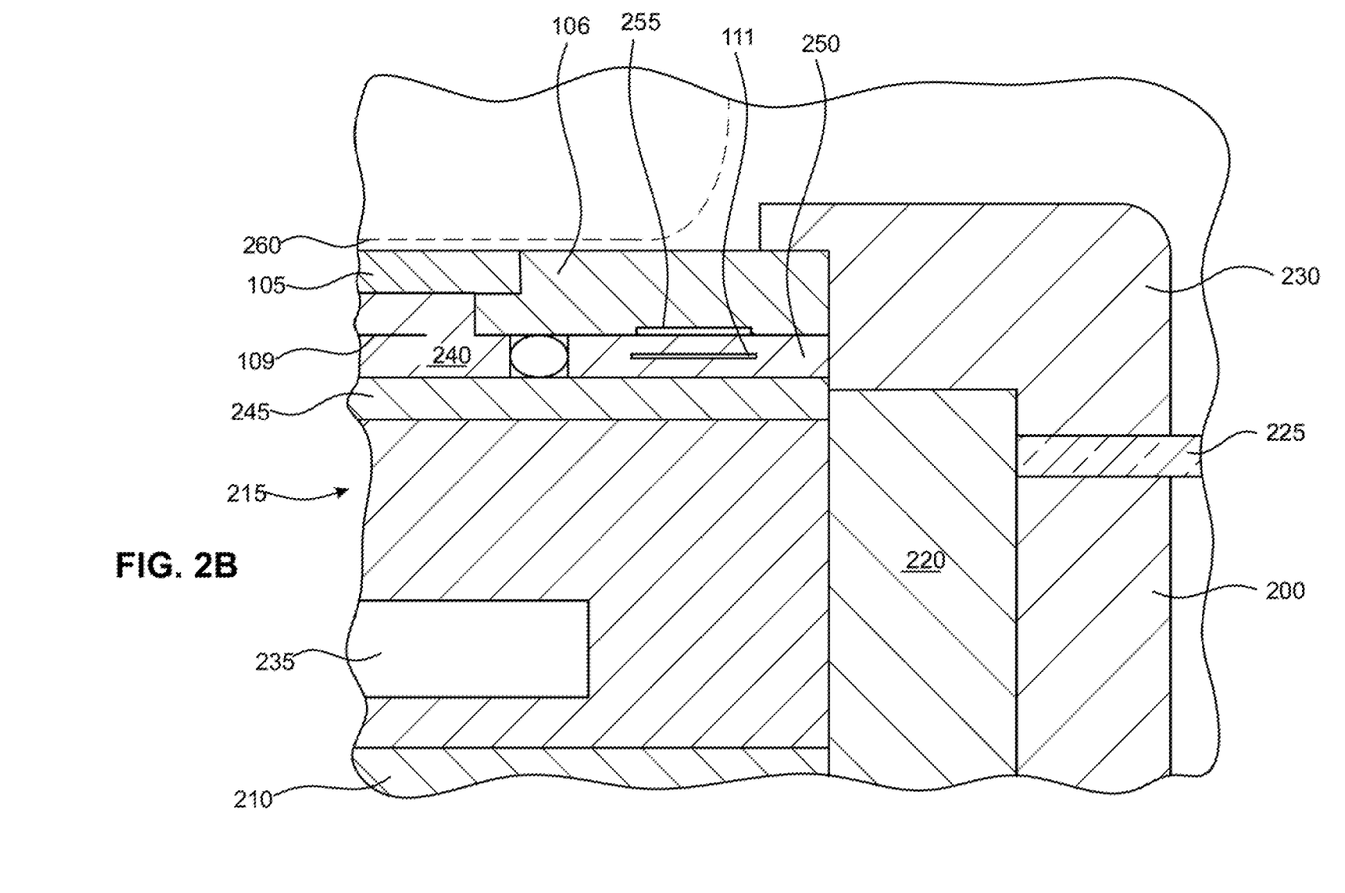

FIGS. 2A and 2B illustrate enlarged schematic side views of portions of the substrate support assembly 104 shown in FIG. 1, according to at least some embodiments of the disclosure. The substrate support assembly 104 includes a ground plate 200 surrounding an insulating layer 205, a facilities plate 210, and an electrostatic chuck 215 assembled in a vertical stack. A quartz pipe ring 220 circumscribes the facilities plate 210 and the electrostatic chuck 215 to insulate the electrostatic chuck 215 from the ground plate 200. The electrostatic chuck 215 includes one or more chucking electrodes (e.g., the first electrode 109) embedded therein for chucking the substrate 105 to a support surface of the electrostatic chuck 215. A plasma shield 225 is disposed on an upper surface of the quartz pipe ring 220 to facilitate plasma containment in the process chamber 100 (shown in FIG. 1). A quartz ring 230 is positioned on an upper surface of the plasma shield 225.

The facilities plate 210 can be made of a conductive material, such as aluminum, or other suitable conductive material, and is positioned between a lower portion of the ground plate 200 and the electrostatic chuck 215. The facilities plate 210 is configured to route fluid and/or gas from an input location (e.g., at a bottom thereof not shown) to an output location (e.g., at a top thereof, not shown). The electrostatic chuck 215 includes one or more channels 235 formed in a first material 236 through which a fluid is provided to facilitate temperature control of the substrate support assembly 104. The first material 236 is a metallic material, such as aluminum. The electrostatic chuck 215 includes the first electrode 109 embedded in a second material 240. The second material 240 is a dielectric material, such as a ceramic material, such as alumina or aluminum nitride. A heater 245 is disposed adjacent to or in the electrostatic chuck 215 to facilitate temperature control of the substrate 105. The heater 245 may be, for example, a resistive heater having a plurality of resistive heating elements embedded therein.

The ceramic ring 250 is disposed on the electrostatic chuck 215 (e.g., on the first material 236, or the heater 245) and surrounds the radially outward edge of the second material 240. The ceramic ring 250 may be made of, for example, alumina or aluminum nitride, and may have a thickness within a range of about 1 millimeter to about 20 millimeters. One or more O-rings can be provided between the ceramic ring 250 and the second material 240 to protect any bonding material otherwise exposed therebetween.

The ring electrode 111 can be a component of the ceramic ring 250 or a separate component. For example, in the illustrated embodiment, the ring electrode 111 is embedded in the ceramic ring 250. The ring electrode 111 may be positioned about 0.3 millimeters to about 1 millimeter from the upper surface of the ceramic ring 250, such as about 0.75 millimeters. The ring electrode 111 may have a width of about 3 millimeters to about 20 millimeters, such as about 15 millimeters.

The ring electrode 111 is positioned radially outward of the perimeter of the substrate 105 and beneath the edge ring 106. In one example, the ring electrode 111 may have an inner diameter greater than 200 millimeters, or greater than 300 millimeters, or greater than 450 millimeters. The ring electrode 111 is electrically coupled to ground and/or matching network 112 through the edge tuning circuit 155 which can include one or more capacitors and/or inductors. The ring electrode 111 may be coupled to the edge tuning circuit 155 through multiple transmission lines 265 (two are shown). For example, the ring electrode 111 may be coupled to the edge tuning circuit 155 through three transmission lines 265 spaced about the substrate support assembly 104 at even intervals (e.g., 120 degrees).

The edge ring 106 is positioned on (over) the ceramic ring 250 and in contact with the ceramic ring 250 and the second material 240. In one example, the edge ring 106 may be formed from silicon carbide, graphite coated with silicon carbide, or low resistivity doped silicon. The edge ring 106 circumscribes the substrate 105 and reduces undesired etching or deposition of material at the radially outward edge of the substrate 105.

Referring to FIG. 2B, during processing, a plasma sheath 260 may form over the surface of the substrate 105 (shown as a dashed line in FIG. 2B). As described above, processing conditions may erode the upper portion of the edge ring 106, causing undesired processing of the edge of the substrate 105, such as rounding, sometimes referred to as a "rollover effect". The undesired processing reduces device yield and affects center-to-edge uniformity. To reduce these undesired effects, conventional approaches frequently replaced the edge ring 106. However, frequent replacement of the edge ring 106 is expensive both in terms of the cost of a new edge ring and in terms of the significant down time required for the replacement of the edge ring.

In contrast to conventional approaches, in examples described herein, the ring electrode 111 is coupled to ground and/or an RF power source (e.g., two or more of the RF power sources 110a-110c) through the edge tuning circuit 155 and matching network 112 to adjust the RF amplitude (and/or phase), and thus the plasma sheath 260, near the edge ring 106. In addition, two or more of the RF power sources 110a-110c and the matching network 112 are configured to be shared during use by the substrate 105 and the ring electrode 111 disposed beneath the edge ring 106.

In some embodiments, a plasma sheath 260 above the edge ring 106 that is thicker or thinner than the plasma sheath 260 above the substrate 105 is desired in order to tune one or a combination of the film etching, deposition profile, or feature tilting angle near the substrate edge. Controlling the RF amplitude and/or RF phase at the edge ring 106 relative to the RF amplitude and/or RF phase at the substrate 105 allows such process edge profile tuning.

Due to the relatively reduced thickness of the ceramic ring 250 in contrast to conventional approaches, RF power initially delivered to the electrostatic chuck 215 has a high RF coupling with the edge ring 106. In other words, the RF amplitude on the edge ring 106 could be higher than the RF amplitude on the substrate 105.

A gap 255 may be provided between an upper surface of the ceramic ring 250 and a lower surface of the edge ring 106. The gap 255 may be utilized to decrease coupling between the ring electrode and the plasma sheath 260 to reduce the RF current to edge tuning circuit 155. The thickness of the gap 255 may be selected to provide a desired amount of decoupling.

In addition to the examples described above, other examples of the disclosure are also contemplated. In one example, the length of the transmission line 265 may have a length that is lambda (wavelength) divided by 2 (e.g., λ/2) to facilitate matched impedance, in at least one frequency. In another example, the width of the ring electrode 111 may be selected to increase or decrease electrical coupling with the edge ring 106, as desired. In another example, the gap 255 may be omitted. In another example, a conductive thermal gasket, for example, a silicone-based thermal gasket, may occupy the gap 255.

In another example, the edge tuning circuit 155 may be coupled to the match network 112 and then to RF power sources 110a-110c instead of, or in addition to, ground. In such an example, the edge tuning circuit 155 would facilitate adjustment of capacitive coupling, rather than a parasitic effect as described above.

The edge tuning circuit 155 can include one or more variable capacitors as well as one or more inductors coupled to the ring electrode 111, as described in greater detail below with respect to FIGS. 4A and 4B. The resonant frequencies of the tuning circuit can be substantially close to the operating frequency, which enables a large variation of RF amplitude that is much larger and much smaller than the RF amplitude of the substrate.

Figure 3A:
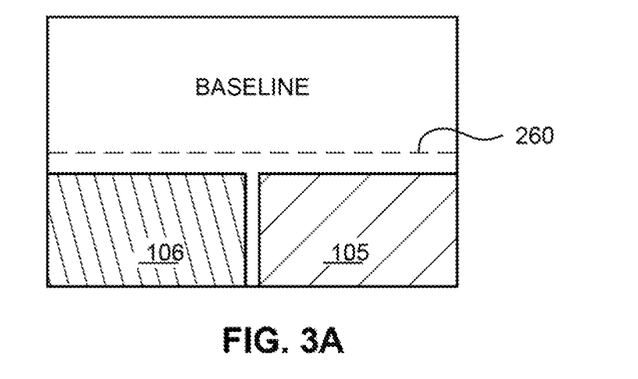
FIGS. 3A-3C are schematic views of a plasma sheath relative to the perimeter of a substrate, according to at least some embodiments of the disclosure.
Figure 3B:
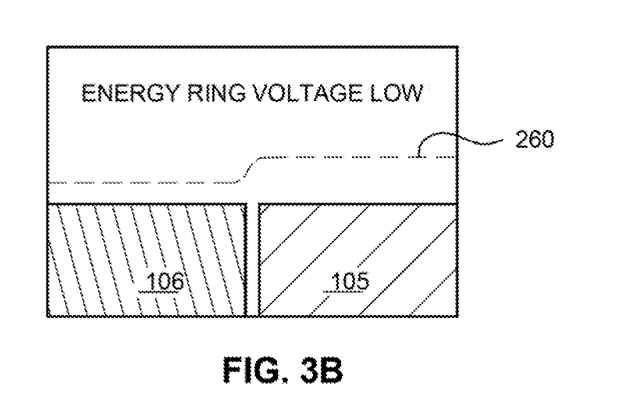
Figure 3C:
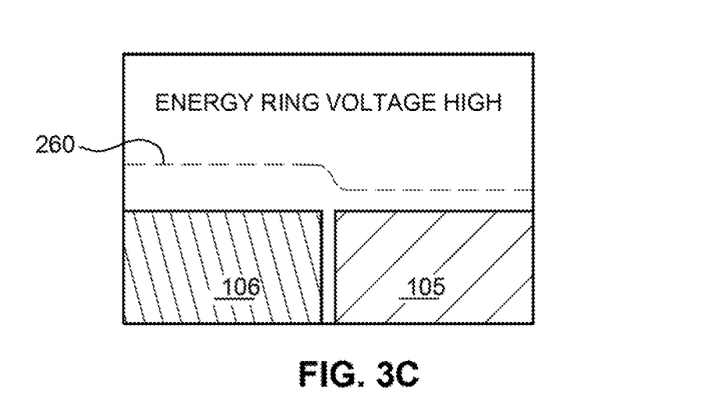

FIGS. 3A-3C are schematic views of a plasma sheath 260 relative to the perimeter of a substrate 105, according to at least some embodiments of the disclosure. FIG. 3A illustrates the plasma sheath 260 relative to an edge ring 106 and a substrate 105 prior to erosion of the edge ring 106. As illustrated in FIG. 3A, the upper surface of the edge ring 106 and the substrate 105 are generally coplanar prior to erosion of the edge ring 106. Prior to erosion of the edge ring 106, the plasma sheath 260 is substantially parallel with and equally spaced from the upper surfaces of the edge ring 106 and the substrate 105. The profile of the plasma sheath 260 illustrated in FIG. 3A results in uniform processing of the substrate 105, particular near the radially outward edge thereof.

After processing a predetermined number of substrates, conditions in the process chamber result in undesired erosion of the edge ring 106. In one example, the upper surface of the edge ring 106 may be eroded, thus reducing the thickness of the edge ring 106. The eroded edge ring 106 no longer shares a coplanar upper surface with the substrate 105. Due to the interaction between the edge ring 106 and charged particles in a plasma, the profile of the plasma sheath 260 is changed in the presence of the eroded edge ring 106, and fails to maintain equidistant spacing between the surface of the edge ring 106 and the substrate 105. The profile of the plasma sheath 260 may result in "rounding" or other undesired processing of the radially outward edge of the substrate 105. Rounding at the substrate edge decreases the usable surface of the substrate 105, thus decreasing device yield per substrate. The undesired rounding may commonly be referred to as the "rollover effect". In conventional systems, to correct rounding, the eroded edge ring 106 would be replaced, thus increasing direct costs as well as the cost of lost-production due to processing down time. In contrast, examples of the present disclosure utilize a ring electrode 111 to adjust the RF amplitude, and then thus the location of the plasma sheath 260, above the eroded edge ring 106. For example. FIGS. 3B and 3C illustrates an edge ring 106 voltage that is low and high, respectively, so that the plasma sheath 260 can be adjusted to reestablish the original (e.g., planar) profile of the plasma sheath 260 after compensating for the eroded edge ring 106 by means of various RF circuits provided in the present disclosure.

The reestablished plasma sheath 260 does not cause a "rollover effect" on the substrate 105, thus preventing damage to the substrate 105 and maximizing the usable surface of the substrate 105. Moreover, because the eroded edge ring 106 may continue to be utilized in an eroded state, the time between preventative maintenances is extended, thus decreasing processing downtime. Additionally, the eroded edge rings require less frequent replacement, thus decreasing expenses for consumable parts.

Figure 4A:
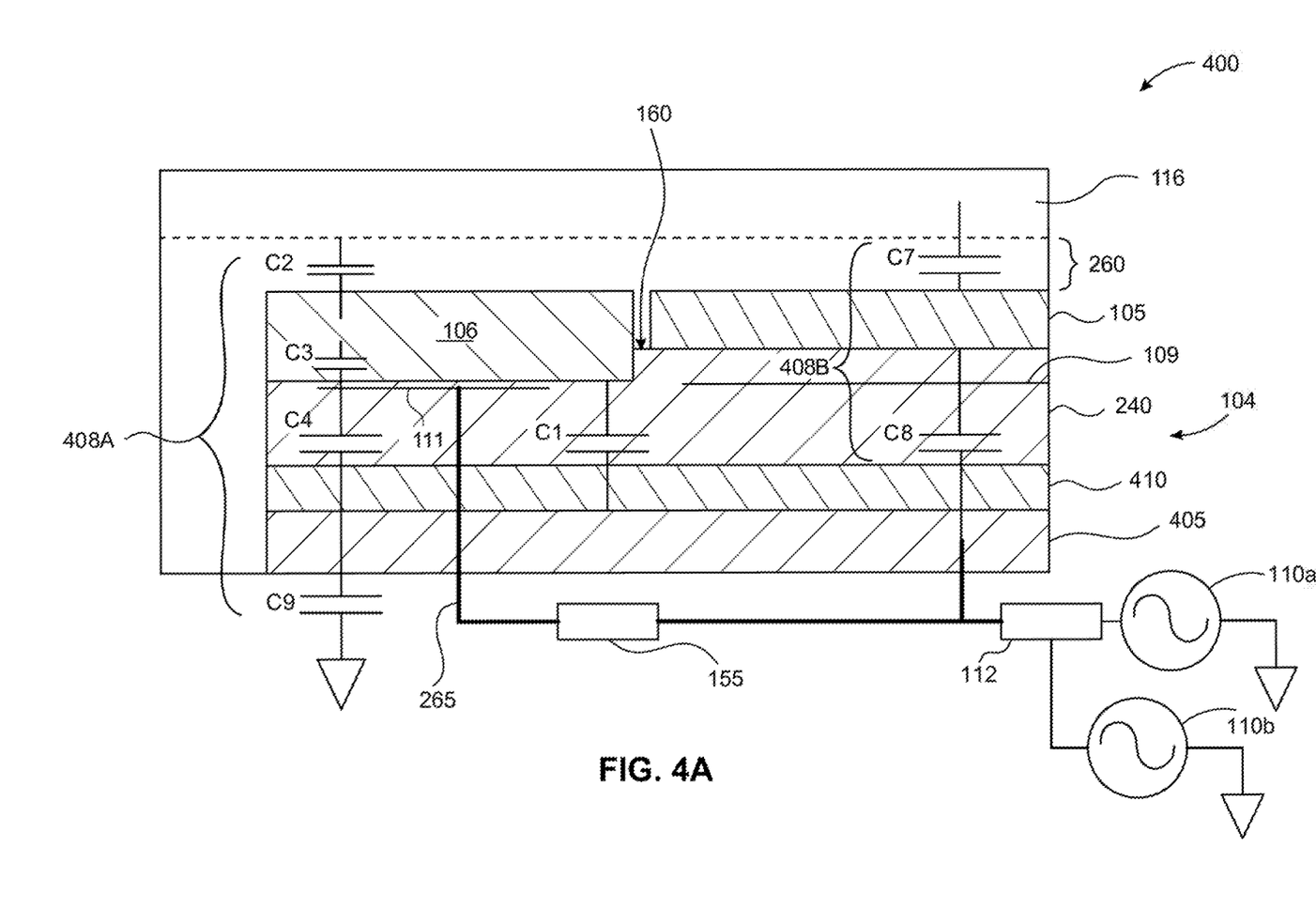
FIGS. 4A and 4B are schematic circuit diagrams illustrating RF circuits, according to at least some embodiments of the disclosure.
Figure 4B:
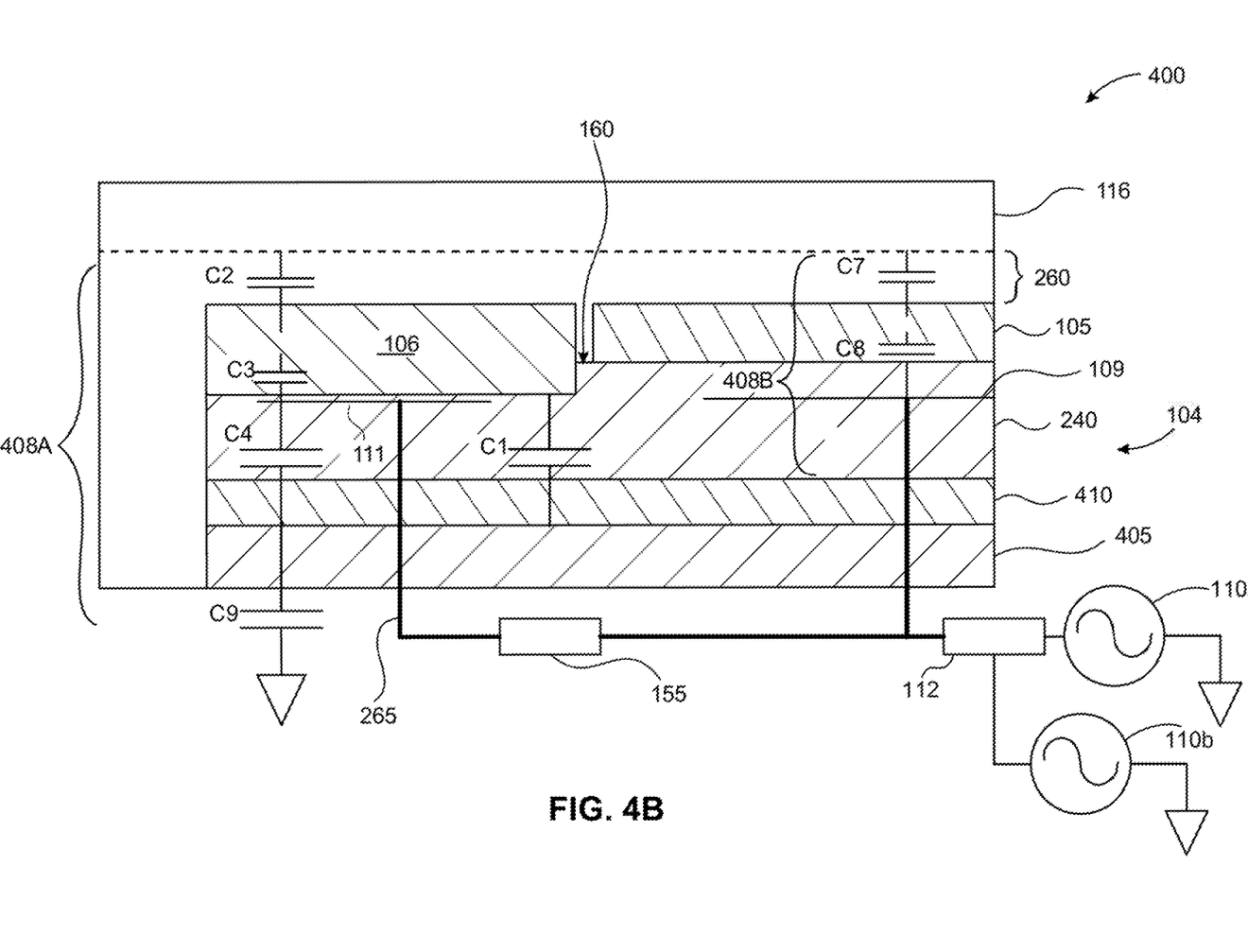

FIGS. 4A and 4B are schematic circuit diagrams illustrating RF circuits, according to at least some embodiments of the disclosure. To facilitate explanation. FIG. 4A illustrates the RF circuit 400A overlaid on a partial view of the substrate support assembly 104. The RF circuit 400A describes the functional relationships among components of a system.

In the RF circuit 400A, a capacitance element C1 is present between a baseplate 405 and the edge ring 106. Two or more of the RF power sources 110 can be coupled to the edge ring 106 and at least one of the baseplate 405, which can be disposed beneath the electrostatic chuck 215, or an electrode (e.g., the first electrode 109) disposed in the electrostatic chuck 215. A capacitance element C2 is present between the edge ring 106 and the plasma 116 in the plasma sheath 260. A capacitance element C3 is a capacitance between the edge ring 106 and the ring electrode 111. A capacitance element C4 is present between the ring electrode 111 and the baseplate 405. A capacitance element C7 is present between the substrate 105 and the plasma 116 within the plasma sheath 260. A capacitance element C8 is a capacitance between the substrate 105 and the baseplate 405 when RF power is launched through (provided to) the baseplate 405. In at least some embodiments, the capacitance element C8 can be a capacitance element between the first electrode 109 and the substrate 105 when RF power is launch through the first electrode 109 (see RF circuit 400B of FIG. 4B, for example). A capacitance element C9 is present between the baseplate 405 and around potential. Capacitance elements C2, C3, C4 and C9 correspond to an edge capacitance circuit 408A. Capacitance elements C7 and C8 correspond to a central capacitance circuit 408B.

In some embodiments, the baseplate 405 corresponds to the facilities plate 210 (shown in FIGS. 2A and 2B). In some embodiments, the heater 245 can be omitted and a bond layer 410 can be disposed between the baseplate 405 (or the facilities plate 210) and the second material 240.

Figure 5A:
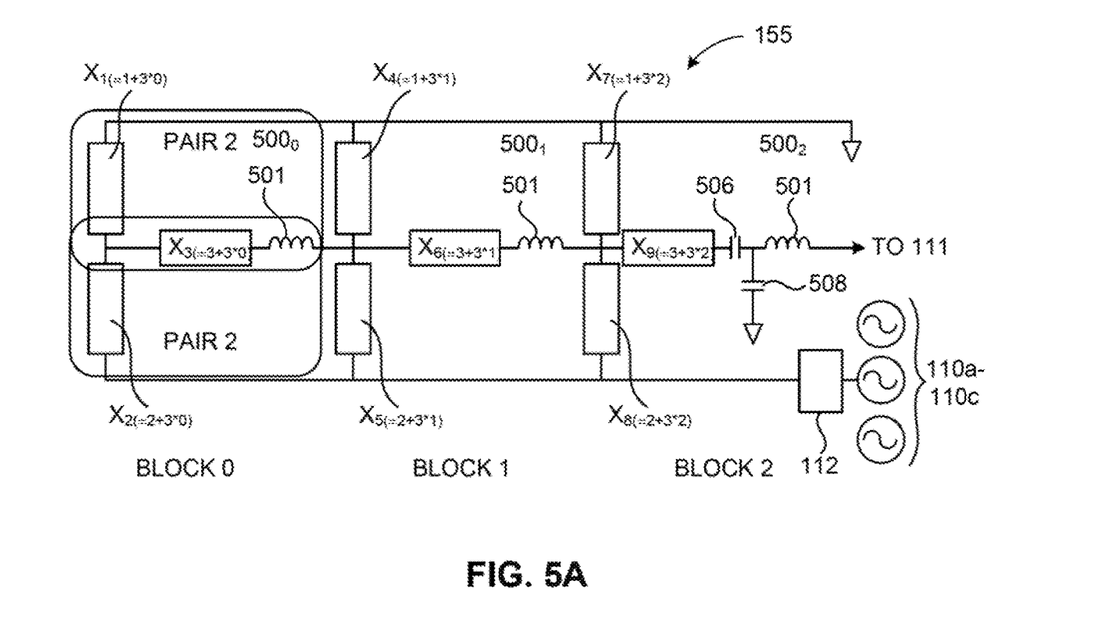
FIGS. 5A-5B are schematic diagrams of an RF circuit, according to at least some embodiments of the disclosure.
Figure 5B:
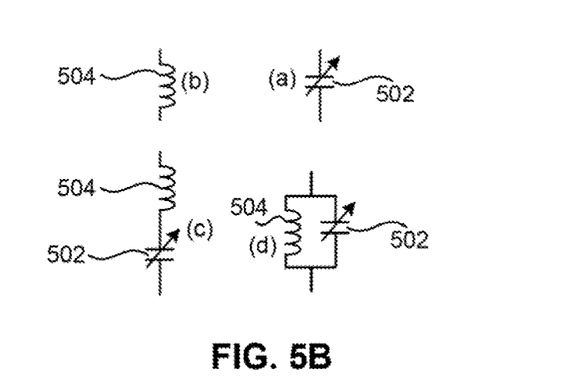
Figure 6:
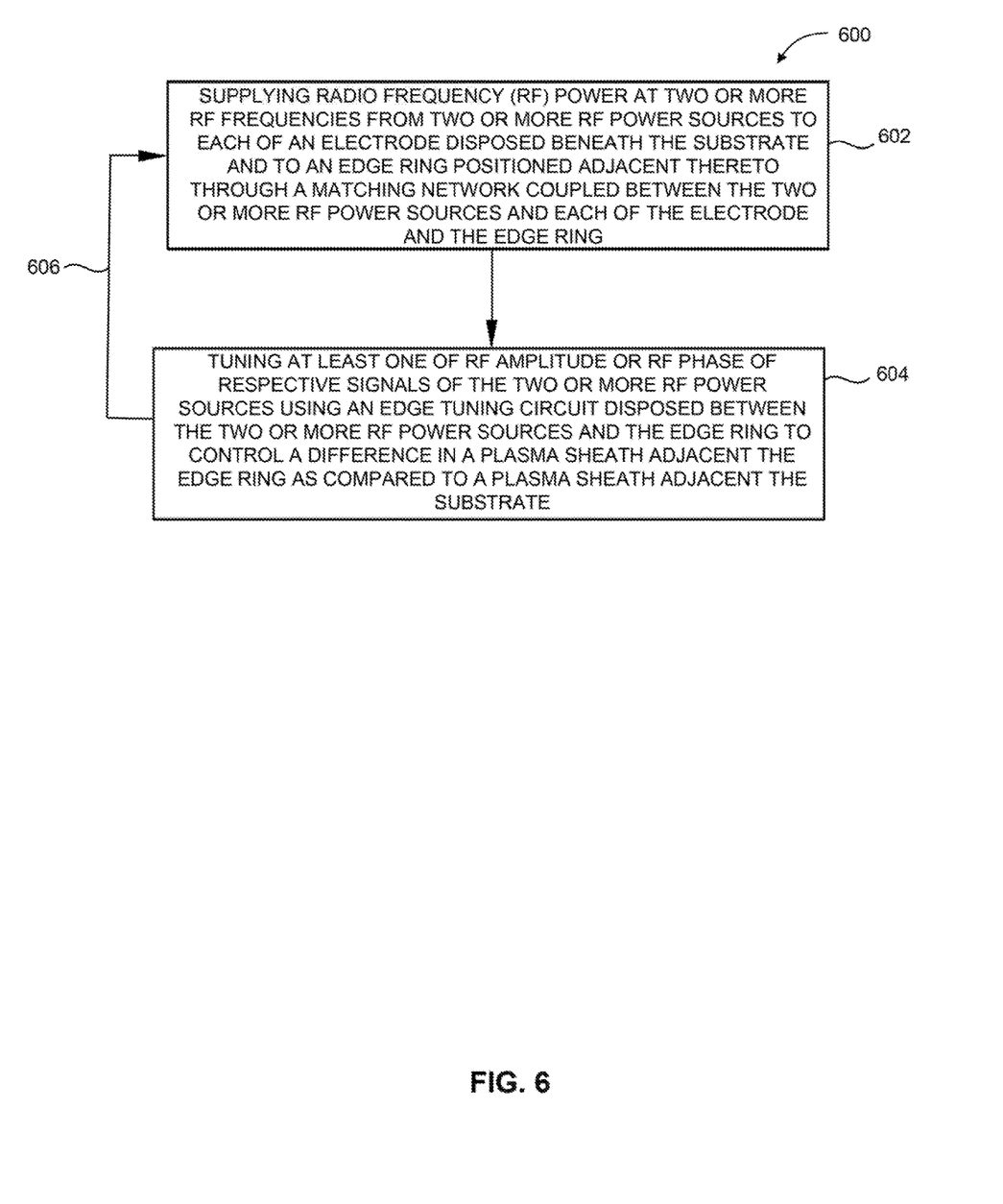
FIG. 6 illustrates a method for of processing a substrate positioned on a substrate support assembly, according to at least some embodiments of the disclosure.

FIGS. 5A-5B are schematic diagrams of the edge tuning circuit 155, and FIG. 6 illustrates a method for of processing the substrate 105 positioned on the substrate support assembly 104, according to at least some embodiments of the disclosure. The edge tuning circuit 155 topology of FIG. 5A can be configured to adjust the edge ring 106 RF amplitude and phase at a multiple number of RF frequencies (e.g., provided by the two or more RF power sources 110a, 110b, 110c, etc.) at the same time when sharing the RF power sources 110a, 110b, 110c, etc. with the substrate 105 side. Additionally, while the RF amplitude and phase are being adjusted at the edge ring 106, an RF voltage at a center of the substrate 105 can be maintained at a constant value.

Referring to FIG. 5A, in at least some embodiments, the edge tuning circuit 155 can include multiple circuit blocks numbered 0, 1, 2, . . . , and connected in parallel between the ground and the matching network 112. For illustrative purposes, the edge tuning circuit 155 is shown including three circuit blocks $500_0$, $500_1$, and $500_2$ (hereinafter simply referred to as circuit blocks $500_n$). The middle legs of the circuit blocks 500n are connected through inductors 501 therebetween, which are connected and to an output of the edge tuning circuit 155 (e.g., the ring electrode 111).

The circuit blocks $500_n$, include two or more electrical components, e.g., circuit block $500_0$ includes electrical components $X_1$-$X_3$ and an additional inductor (e.g., inductor 501) in the middle leg, e.g., to supplement the inductor present in $X_1$. Each of the inductors 501 in the circuit blocks $500_n$ can have the same inductance or different inductance, depending on an inductance of inductors in the individual electrical components of the circuit blocks $500_n$. Similarly, circuit blocks $500_1$ and $500_2$ include electrical components $X_4$-$X_6$ and $X_7$-$X_9$, respectively. Each of the electrical components $X_1$-$X_9$ can have four possible configurations, as shown in FIG. 5B. For example, each of the electrical components $X_1$-$X_9$ can include one or more of a variable capacitor 502 (see (a) of FIG. 5B), an inductor 504 (see (b) of FIG. 5B), the variable capacitor 502 and the inductor 504 in series (see (c) of FIG. 5B), and/or the variable capacitor 502 and the inductor 504 in parallel (see (d) of FIG. 5B). In at least some embodiments, the inductor 504 can be a variable inductor. In at least some embodiments, the electrical components $X_1$-$X_3$ of the circuit block $500_0$ of the edge tuning circuit 155 can include one or more inductors 504 and one or more variable capacitors 502 (and/or one or more of the LC series and/or LC parallel circuits) in one or more pairs. In at least some embodiments, the variable capacitor 502 of (a) in FIG. 5B can be the same as or different from the variable capacitor 502 in (c) and (d). Similarly, the inductor 504 of (b) in FIG. 5B can be the same as or different from the inductor 504 in (c) and (d).

The electrical components $X_1$, $X_2$, $X_3$, etc. within the circuit blocks $500_n$ can be represented by the general nomenclature $X_{i+n}$, where n=0, 1, 2, . . . and represents a circuit block number, and i=1, 2, 3 and represents the component's relative location within a circuit block, and the 3 represents the number of electrical components in a circuit block. The components $X_{1+3n}$'s are connected between the ground and the middle leg, the components $X_{2+3n}$'s are connected between the input line of the tuning circuit (e.g., output of the match network 112) and the middle leg, and the components $X_{3+3n}$'s are connected in the middle leg. For example, within the circuit block $500_1$, n=1, the three X components are numbered with 4 (=1+3*1), 5(=2+3*1) and 6 (=3+3*1) e.g., $X_4$, $X_5$, and $X_6$.

Every circuit block $500_n$ has two pairs ($X_{1+3n}$, $X_{2+3n}$) and ($X_{1+3n}$, $X_{3+3n}$). For example, circuit block $500_0$ includes pairs ($X_1$, $X_2$) and ($X_1$, $X_3$), as shown in FIG. 5A. Each of the component pairs ($X_{1+3n}$, $X_{2+3n}$) or ($X_{1+3n}$, $X_{3+3n}$) includes at least one variable capacitor 502 (e.g., as shown in FIG. 5B (a), (c), and/or (d)) and at least one inductor 504 (e.g., as shown in FIG. 5B (b), (c), and/or (d)). For example, within circuit block $500_0$, n=0, the two pairs ($X_1$, $X_2$) and ($X_1$, $X_3$) each include the variable capacitor 502 (e.g., as shown in FIG. 5B(a), (c), and/or (d)) and the inductor 504 (e.g., as shown in FIG. 5B (b), (c), and/or (d)). Similarly, within circuit block $500_1$, n=1, the two pairs ($X_4$, $X_5$) and ($X_4$, $X_6$) each include the variable capacitor 502 (e.g., as shown in FIG. 5B (a), (c), and/or (d)) and the inductor 504 (e.g., as shown in FIG. 5B (b), (c), and/or (d)). Likewise, within circuit block $500_2$, n=2, the two pairs ($X_7$, $X_8$) and ($X_7$, $X_9$) each include the variable capacitor 502 (e.g., as shown in FIG. 5B (a), (c), and/or (d)) and the inductor 504 (e.g., as shown in FIG. 5B (b), (c), and/or (d)). In at least some embodiments, if $X_{1+3n}$ in circuit block $500_n$ does not include a series inductor (e.g., as shown in FIG. 5B (a), and/or (d)), a separate inductor can be placed in the middle leg of the circuit block closer to the output. For example, in FIG. 5A, each circuit block $500_n$ comprises an inductor 501 in the middle leg. In at least some embodiments, the fourth inductor in the middle leg is not included in the circuit block closest to the output of the edge tuning circuit 155.

As noted above, the edge tuning circuit 155 operates near resonance which enables the edge tuning circuit 155 to adjust a voltage higher or/and lower than the RF power sources 110. Accordingly, each of circuit blocks of the circuit blocks $500_n$ can tune two RF frequencies independently and at the same time, with at least two variable capacitors 502 within a circuit block, e.g., circuit block $500_0$. When more than two RF frequencies need to be tuned at the same time, more than one circuit block of circuit blocks $500_n$ can be connected in parallel, as described above and shown in FIG. 5A. When an odd number of RF frequencies need to be tuned simultaneously, one variable capacitor in one of the electrical components $X_{1+3n}$ can be replaced with a fixed capacitor (not shown), or one of the electrical components $X_{i+3n}$ need not be used, e.g., $X_5$ or $X_8$.

In at least some embodiments, such as when a non-zero DC voltage is required at an output, a blocking capacitor 506 (e.g., having a relatively large capacitance compared to the variable capacitor 502) can be placed in a middle leg of a circuit block and a DC power supply 508 can be placed between the blocking capacitor 506 and an output (e.g., the ring electrode 111). If at least one capacitor (e.g., variable or fixed capacitor) is already provided in the middle leg, the DC power supply 508 can be placed between the output (e.g., the ring electrode 111) and a capacitor nearest to the output. For example, in the circuit block 500$_2$ of FIG. 5A, the blocking capacitor 506 can be placed between the electrical component X$_7$ and the inductor 501 closest to the output, and a DC power supply 508 can be connected on the output side of the blocking capacitor 506.

FIG. 6 illustrates a method 600 for of processing a substrate positioned on a substrate support assembly (e.g., using the edge tuning circuit 155 including circuit blocks 500$_n$ of FIG. 5), according to at least sonic embodiments of the disclosure. When power is applied to the ring electrode 111 (e.g., supplying RF power from two or more of the RF power sources 110 at different RF frequencies), RF voltage and current develop at the edge ring 106 as a result of coupling, as described above. A relation between an RF voltage and phase at the edge ring 106 versus voltage and phase at the output of the edge tuning circuit 155 (e.g., including one or more of the circuit blocks 500$_n$) follows the physical rules of transmission line theory and circuit theory, which can be calibrated and determined for a specific hardware configuration for each RF frequency of the RF power sources 110. Similarly, a relation between the RF voltage and phase at the substrate 105 versus voltage and phase at the output of the match network 112 can also be calibrated and determined for a specific hardware configuration for each RF frequency of the RF power sources 110. Accordingly, in at least some embodiments, the edge tuning circuit 155 can be calibrated to find a relation of RF amplitude and phase between the substrate 105 and the output of the edge tuning circuit 155 at each RF frequency of RF power sources 110*a*, 110*b*, 110*c*, etc. Similarly, a relation of RF amplitude and RF phase between the edge ring 106 and the output of the match network 112 can also be calibrated.

At 602, RF power at two or more RF frequencies is supplied from two or more RF power sources (e.g., the RF power sources 110*a*, 110*b*, 110*c*) to each of an electrode disposed beneath substrate and to an edge ring (e.g., the edge ring 106) positioned adjacent thereto through a matching network (e.g., the matching network 112) coupled between the two or more RF power sources and each of the electrode and the edge ring. More particularly, during plasma processing of the substrate 105, RF power from two or more of the RF power sources 110*a*, 110*b*, 110*c*, etc. is supplied fed to the substrate 105 by coupling through the match network 112 and the baseplate 405 or the first electrode 109 (e.g. the chucking electrode). At the same time, RF power from the RF power sources 110*a*, 110*b*, 110*c*, etc. is also supplied/fed to the edge ring 106 by coupling Through the match network 112, the edge tuning circuit 155, and the ring electrode 111.

Next 604, at least one of RF amplitude or RF phase of respective signals of the two or more RF power sources can be tuned using an edge tuning circuit disposed between the two or more RF power sources and the edge ring, e.g., to control a difference in a plasma sheath adjacent the edge ring as compared to a plasma sheath adjacent the substrate.

More particularly, an RF voltage, RF current, and/or RF phase at the outputs of the edge tuning circuit 155 and the match network 112 can be measured at each RF frequency of the two or more RF power sources 110. Thereafter, an RF amplitude and/or an RF phase of respective signals of the two or more RF power sources 110*a*, 110*b*, 110*c*, etc. can be simultaneously tuned.

For example, based on the measured RF voltage, RF current, and/or RF phase at the outputs of the edge tuning circuit 155 and the match network 112, an RF amplitude and RF phase at the substrate 105 and the edge ring 106 can be calculated. For example, using the calibration model described above, the RF voltage, RF current, and/or RF phase at the substrate 105 and the edge ring 106 can be measured/calculated at each RF frequency of the RF power sources, using, for example, the system controller 108.

To compensate for erosion of the edge ring 106 or plasma sheath non-uniformity or feature tilting near an edge of the substrate 105, various RF voltage ratios between the substrate 105 and the edge ring 106 at different RF frequencies can be calculated (targeted) in various plasma processing, conditions. Similarly, various phase differences between the substrate 105 and the edge ring 106 can also be calculated (targeted). To achieve the targeted voltage ratios and phase differences at each of the RF frequencies simultaneously, desired variable capacitor(s) 502 values within the circuit blocks 500$_n$ of the edge tuning circuit 155 can be calculated based on, for example, the circuit model of FIGS. 4A and 4B and the pre-calibrated results described above, Such calculation can be performed using the system controller 108.

Using, the calculated capacitance values, the variable capacitors 502 can be adjusted. While the variable capacitors 502 are being adjusted, the system controller 108 monitors the RF voltage, RF current, and/or RF phase at outputs of the edge tuning circuit 155 and the match network. 112 to readjust the model predicted capacitor values for achieving the target voltage ratios and phase differences at the multiple RF frequencies.

The output power of the two or more RF power sources 110 can be adjusted to keep the substrate 105 at constant RF voltages at each of the applied RF frequencies while the one or more variable capacitors 502 in the circuit blocks 500$_n$ of the edge tuning circuit 155 are being adjusted. In doing so, a process performance at the center of the substrate 105 is unaffected while tuning the process performance on the substrate edge by tuning the edge tuning circuit 155, e.g., thus advantageously providing a tuning knob for extreme edge process profile control and feature tilting correction with minimal or no impact on plasma parameters at the substrate center. Additionally, examples described herein allow for the plasma sheath to be adjusted adjacent the substrate edge without affecting the plasma parameters at substrate center, thus providing a tuning knob for extreme edge process profile control and feature tilting correction, and improving device yield while mitigating downtime, particles and reducing expenditures on consumables.

To achieve and maintain the targeted voltage ratio and phase difference between the substrate 105 and the edge ring 106 while keeping RF voltage constant at the substrate 105, a closed control feedback loop 606 from 602 to 604 is implemented by the system controller 108 throughout the plasma processing time.

Testing of the substrate support assembly 104 having the RF circuit 400A and the RF circuit 400B shows enhanced plasma control at the edge of a substrate. Further, feature tilting control is enhanced. For example, tests with a 300 mm substrate indicate that low voltages and high voltages applied to the ring electrode 111 below the edge ring 106 has been shown to produce a range of greater than about 7 degrees at a radius 146 mm, or greater. Additionally, testing of a substrate support assembly 104 with a quartz cover ring (not shown) yielded results similar to tests of the substrate support assembly 104 without the quartz cover ring. Thus, utilizing a quartz cover ring provides plasma sheath control as well as reducing particle generation.

While the foregoing is directed to embodiments of the present disclosure, other and further embodiments of the disclosure may be devised without departing from the basic scope thereof.

The invention claimed is:

1. A substrate support assembly, comprising:
an electrostatic chuck having one or more chucking electrodes embedded therein for chucking a substrate to a substrate support surface of the electrostatic chuck;
an edge ring disposed on the electrostatic chuck and surrounding the substrate support surface;
two or more radio frequency (RF) power sources coupled to the edge ring and at least one of a baseplate disposed beneath the electrostatic chuck or an electrode disposed in the electrostatic chuck;
a matching network coupling the edge ring to the two or more RF power sources; and
an RF circuit coupling the edge ring to the two or more RE power sources, the RF circuit configured to simultaneously tune at least one of an RE amplitude or an RF phase of respective signals of the two or more RF power sources using two or more circuit blocks connected in parallel with each other and disposed between the two or more RF power sources and the edge ring.

2. The substrate support assembly of claim 1, further comprising:
a controller configured to adjust two or more variable capacitors to manipulate at least one of an RF voltage, RF current, or RF phase at the edge ring via a ring electrode coupled to the RF circuit and disposed beneath the edge ring.

3. The substrate support assembly of claim 1, wherein the RF circuit operates near resonance, and
wherein the two or more circuit blocks each comprises an electrical component connected between ground and a middle leg of the circuit block, an electrical component connected between an input line of the match network and the middle leg of the circuit block, and an electrical component connected in the middle leg of the circuit block.

4. The substrate support assembly of claim 3, wherein the electrical components include a variable capacitor and at least one of an inductor, a variable capacitor in series with an inductor, or a variable capacitor in parallel with an inductor.

5. The substrate support assembly of claim 3, wherein an output of one of the two or more circuit blocks comprises a blocking capacitor and a DC power supply disposed between the blocking capacitor and the output of one of the two or more circuit blocks.

6. The substrate support assembly of claim 1, wherein the two or more RF power sources are coupled to the electrode disposed in the electrostatic chuck.

7. The substrate support assembly of claim 1, wherein the two or more RF power sources are coupled to the baseplate.

8. The substrate support assembly of claim 1, further comprising a DC power source coupled to a ring electrode disposed beneath the edge ring and configured to provide a clamping force on the edge ring during operation.

9. The substrate support assembly of claim 1, wherein the two or more RF power sources and the matching network are configured to be shared during use by the substrate and a ring electrode disposed beneath the edge ring.

10. A process chamber comprising:
a chamber body;
a lid disposed on the chamber body;
a plasma apparatus positioned above the lid; and
a substrate support assembly positioned within the chamber body, the substrate support assembly comprising:
an electrostatic chuck having one or more chucking electrodes embedded therein for chucking a substrate to a substrate support surface of the electrostatic chuck;
an edge ring disposed on the electrostatic chuck and surrounding the substrate support surface;
two or more radio frequency (RF) power sources coupled to the edge ring and at least one of a baseplate disposed beneath the electrostatic chuck or an electrode disposed in the electrostatic chuck;
a matching network coupling the edge ring to the two or more RF power sources; and
an RF circuit coupling the edge ring to the two or more RF power sources, the RF circuit configured to simultaneously tune at least one of an RF amplitude or an RF phase of respective signals of the two or more RF power sources using two or more circuit blocks connected in parallel with each other and disposed between the two or more RF power sources and the edge ring.

11. The process chamber of claim 10, further comprising:
a controller configured to adjust two or more variable capacitors to manipulate at least one of an RF voltage, RF current, or RF phase at the edge ring via a ring electrode coupled to the RF circuit and disposed beneath the edge ring.

12. The process chamber of claim 10, wherein the RF circuit operates near resonance, and
wherein the two or more circuit blocks each comprises an electrical component connected between ground and a middle leg of the circuit block, an electrical component connected between an input line of the match network and the middle leg of the circuit block, and an electrical component connected in the middle leg of the circuit block.

13. The process chamber of claim 12, wherein the two or more electrical components include a variable capacitor and at least one of an inductor, a variable capacitor in series with an inductor, or a variable capacitor in parallel with an inductor.

14. The process chamber of claim 12, wherein an output of one of the two or more circuit blocks comprises a blocking capacitor and a DC power supply disposed between the blocking capacitor and the output of one of the two or more circuit blocks.

* * * * *

UNITED STATES PATENT AND TRADEMARK OFFICE
CERTIFICATE OF CORRECTION

PATENT NO. : 11,276,601 B2
APPLICATION NO. : 16/845479
DATED : March 15, 2022
INVENTOR(S) : Linying Cui et al.

Page 1 of 1

It is certified that error appears in the above-identified patent and that said Letters Patent is hereby corrected as shown below:

In the Specification

In Column 2, Line 7, delete "strike" and insert --surface--
In Column 4, Line 31, delete "cart" and insert --can--
In Column 5, Line 20, delete "a" and insert --a DC--
In Column 5, Line 23, delete "to" and insert --(e.g., to--
In Column 5, Line 35, delete "140" and insert --140,--
In Column 6, Line 9, delete "thereof" and insert --thereof,--
In Column 7, Line 37, delete "electrode" and insert --electrode 111--
In Column 8, Line 36, delete "For example." and insert --For example,--
In Column 8, Line 53, delete "explanation." and insert --explanation,--
In Column 9, Line 12, delete "around" and insert --ground--
In Column 9, Line 44, delete "$500_n$," and insert --$500_n$--
In Column 11, Line 12, delete "sonic" and insert --some--
In Column 11, Line 51, delete "coupling Through" and insert --coupling through--
In Column 12, Line 12, delete "processing," and insert --processing--
In Column 12, Line 21, delete "above," and insert --above.--
In Column 12, Line 23, delete "Using," and insert --Using--

In the Claims

In Column 13, Line 19, Claim 1, delete "RE" and insert --RF--
In Column 13, Line 21, Claim 1, delete "RE" and insert --RF--

Signed and Sealed this
Twenty-sixth Day of April, 2022

Katherine Kelly Vidal
*Director of the United States Patent and Trademark Office*